(12) United States Patent
Huang et al.

(10) Patent No.: US 8,461,619 B2
(45) Date of Patent: Jun. 11, 2013

(54) LIGHT EMITTING DIODE CHIP AND METHOD OF MANUFACTURING THE SAME

(75) Inventors: Chia-Hung Huang, Hsinchu (TW); Shih-Cheng Huang, Hsinchu (TW); Po-Min Tu, Hsinchu (TW); Shun-Kuei Yang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/397,688

(22) Filed: Feb. 16, 2012

(65) Prior Publication Data

US 2012/0273830 A1 Nov. 1, 2012

(51) Int. Cl.
*H01L 33/36* (2010.01)

(52) U.S. Cl.
USPC .......................................................... 257/99

(58) Field of Classification Search
USPC ................................ 438/22; 257/99, E33.062
See application file for complete search history.

(56) References Cited

U.S. PATENT DOCUMENTS

| | | | | |
|---|---|---|---|---|
| 6,583,446 B1 * | 6/2003 | Taninaka et al. | ................. | 257/93 |
| 7,015,055 B2 * | 3/2006 | Oohata et al. | ................... | 438/22 |
| 7,504,667 B2 * | 3/2009 | Fujikura et al. | ................. | 257/98 |
| 7,655,975 B2 * | 2/2010 | Hirler et al. | ..................... | 257/331 |
| 7,745,241 B2 * | 6/2010 | Chang | .............................. | 438/28 |
| 7,841,758 B2 * | 11/2010 | Lai | ................................. | 362/606 |
| 8,193,554 B2 * | 6/2012 | Fujita et al. | ..................... | 257/99 |
| 2006/0281203 A1* | 12/2006 | Epler et al. | ...................... | 438/22 |
| 2007/0221927 A1* | 9/2007 | Chen et al. | ....................... | 257/79 |
| 2009/0269896 A1* | 10/2009 | Chen et al. | ..................... | 438/271 |
| 2010/0140651 A1* | 6/2010 | Noda et al. | ...................... | 257/98 |
| 2011/0012150 A1* | 1/2011 | Kim et al. | ....................... | 257/98 |

* cited by examiner

*Primary Examiner* — Thao P. Le
(74) *Attorney, Agent, or Firm* — Altis Law Group, Inc.

(57) ABSTRACT

An LED chip includes a substrate, a first type semiconductor layer, a light-emitting layer, a second type semiconductor layer, a first electrode and a second electrode formed on the substrate in sequence. A surface of the first type semiconductor layer away from the substrate comprises an exposed first area and a second area covered by the light-emitting layer. The first electrode is formed on the exposed first area of the substrate. A number of recesses are defined in the second area of the surface of the first type semiconductor layer. The recesses are spaced apart from each other and arranged in sequence in a direction away from the first electrode; depths of the recesses gradually decrease following an increase of a distance between the recesses and the first electrode. The second electrode is formed on the second type semiconductor layer.

11 Claims, 3 Drawing Sheets

US 8,461,619 B2

LIGHT EMITTING DIODE CHIP AND METHOD OF MANUFACTURING THE SAME

BACKGROUND

1. Technical Field

The present disclosure generally relates to light emitting diode (LED) chips and method of manufacturing the same.

2. Description of Related Art

A light-emitting diode (LED) device is a lighting device made of semiconductor materials. The LED device has the advantages of small size, low power consumption, no radiation, mercury-free, long lifetime, fast response speed and high reliability. With the continuous progress of the recent technology, the application range thereof covers the information, communication, customer electronics, vehicle, lighting and traffic sign.

With reference to FIG. 3, a conventional LED device 9 includes a substrate 91, an epitaxial layer 92, a buffer layer 94, an N-type electrode 96, a P-type electrode 97 and a transparent conductive layer 98. The buffer layer 94, epitaxial layer 92 and transparent conductive layer 98 are disposed on the substrate 91 in sequence.

The epitaxial layer 92 includes an N-type semiconductor layer 921, a light-emitting layer 922 and a P-type semiconductor layer 923 in sequence. The N-type semiconductor layer 921 is disposed on the buffer layer 94. The light-emitting layer 922 is disposed on the N-type semiconductor layer 921. The P-type semiconductor layer 923 is disposed on the light-emitting layer 922. The N-type electrode 96 is electrically connected to the transparent conductive layer 98 via the epitaxial layer 92, and the P-type electrode 97 is directly electrically connected to the transparent conductive layer 98.

In general, the voltage and current of the LED device 9 usually have an exponential relationship. When the N-type electrode 96 and the P-type electrode 97 are applied with a voltage larger than the threshold voltage, the current through the LED device 9 is increased sharply. At the same time, the LED device 9 starts to light.

However, in the conventional structure of the LED device 9, the current distribution is non-uniform and is concentrated in the area A. This will cause the exceed current density in a localized area, which affects the lighting efficiency and results in overheat of the localized area. Moreover, the lifetime of the LED device 9 will be shortened.

Therefore, it is necessary to provide an LED package and method of manufacturing the same which can overcome the above shortcomings.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Reference will now be made to the drawings to describe the present LED chip and method for manufacturing the same in detail.

Figure 1:
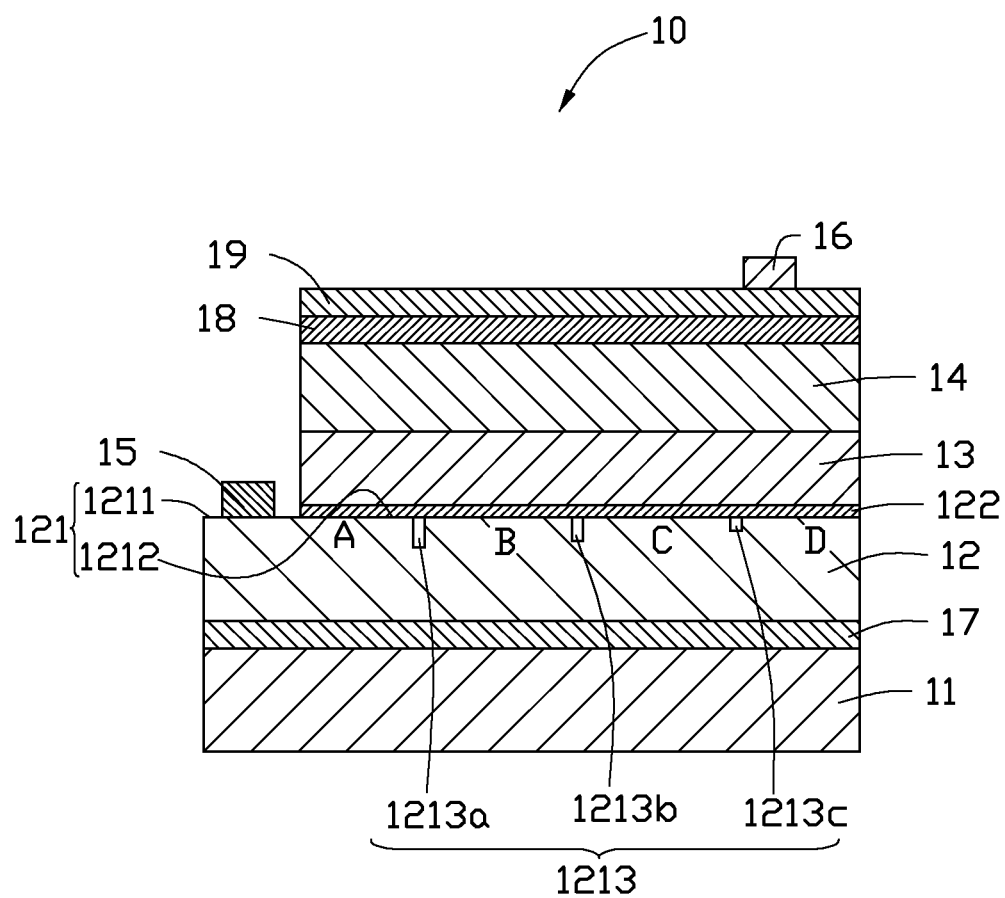
FIG. 1 is a schematic, cross-sectional view showing an LED chip in accordance with an embodiment of the present disclosure.

Referring to FIG. 1, an LED chip 10 according to an exemplary embodiment includes a substrate 11, a first type semiconductor layer 12, a light-emitting layer 13 and a second type semiconductor layer 14, a first electrode 15, a second electrode 16.

The substrate 11 is made of $Al_2O_3$, SiC, Si, GaN, ZnO or combinations thereof. The first type semiconductor layer 12, the light-emitting layer 13 and the second type semiconductor layer 14 are formed on the substrate 11 in sequence. The first type semiconductor layer 12 and the second type semiconductor layer 14 can be, for example but not limited to, an N-type epitaxial layer and a P-type epitaxial layer, respectively. Alternatively, the first type semiconductor layer 12 and the second type semiconductor layer 14 can be a P-type epitaxial layer and an N-type epitaxial layer, respectively.

A surface 121 of the first type semiconductor layer 12 away from the substrate 11 has an exposed first area 1211 and a second area 1212 covered by the light-emitting layer 13. The light-emitting layer 13 and the second type semiconductor layer 14 are formed on the second area 1212 of the surface 121 of the first type semiconductor layer 12 in sequence. It can be understood that, a buffer layer 17 can be formed on the substrate 11 firstly for easing the subsequent formation of crystal growth and reducing the lattice mismatch between the substrate 11 and the first type semiconductor layer 12. The buffer layer 17 may be made of GaN or AlN. In addition to that shown in FIG. 1 that the exposed first area 1211 is formed at a single lateral side of the second area 1212, the exposed first area 1211 of the surface 121 of the first type semiconductor layer 12 may be formed as a ring surrounding the second area 1212 of the surface 121, in which the light emitting layer 13 with the structure thereabove is located at a central portion of the first type semiconductor layer 12. The light-emitting layer 13 may be a single quantum well structure or multiple quantum well structure.

Figure 2:
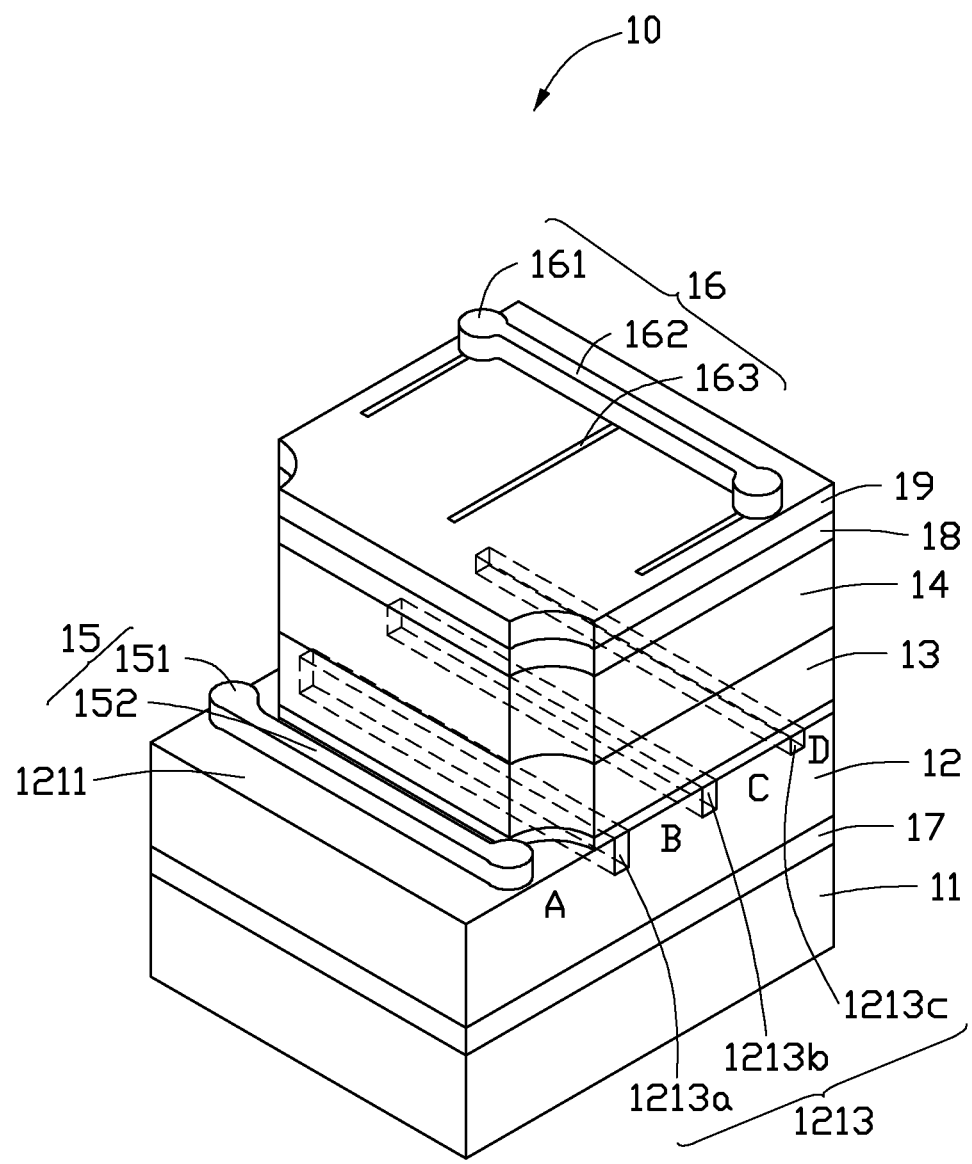
FIG. 2 is an isometric view of the LED chip of FIG. 1.
Figure 3:
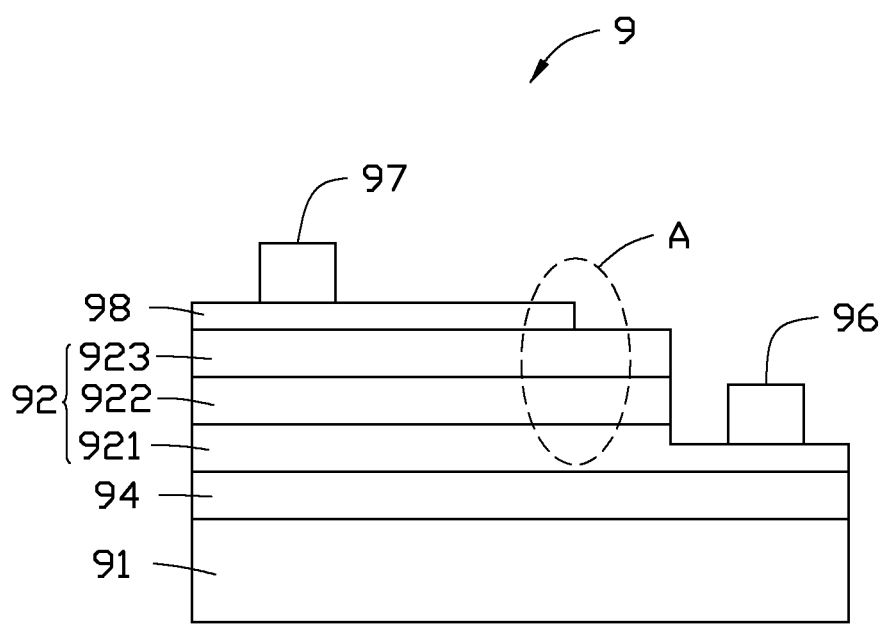
FIG. 3 is a schematic, side view showing a conventional LED chip.

Referring to FIG. 2 also, the first electrode 15 is formed on the exposed first area 1211 of the surface 121 of the first type semiconductor layer 12, and the second electrode 16 is formed on the second type semiconductor layer 14. To improve the ohmic contact efficiency between the second electrode 16 and the second type semiconductor layer 14 and the current distribution of the second electrode 16, an ohmic contact layer 18 and a transparent conductive layer 19 can be formed between the second type semiconductor layer 14 and the second electrode 16. In the embodiment, the material of the ohmic contact layer 18 can be InAlGaN doped with Mg, or GaN doped with Mg. The transparent conductive layer 19 can be indium tin oxide (ITO), aluminum-doped zinc oxide (AZO), nickel/aluminum alloy (Ni/Au), zinc oxide or zinc gallium oxide (GZO). The first electrode 15 and the second electrode 16 can be, for example but not limited to, N-type electrode and P-type electrode. Of course, alternatively, the first electrode 15 and the second electrode 16 can be a P-type electrode and an N-type electrode, respectively.

The first electrode 15 includes two pads 151 and a connecting portion 152 between the two pads. The two pads 151 of the first electrode 15 are respectively located at two ends of the first electrode 15. The first electrode 15 extends in a lengthwise direction of the exposed first area 1211 of the surface 121 of the first type semiconductor layer 12. The second electrode 16 includes two pads 161, a connecting portion 162 between the two pads 161, and a number of arms 163 respectively extending from the pads 161 and a middle of the connecting portion 162 along a direction substantially perpendicular to the connecting portion 162. The connecting portion 162 is substantially parallel to the connecting portion 152 of the first electrode 15. The placement of the arms 163 of the second electrode 16 is helpful for improving uniform current distribution from the second electrode 16 to the second type semiconductor layer 14. The pads 151, 161 may be made of Ti, Cr and other materials which are advantageous for deposition.

The second area 1212 of the surface 121 of the first type semiconductor layer 12 has a plurality of recesses 1213 defined therein. The recesses 1213 are spaced apart from each other and arranged in sequence in a direction away from the first electrode 15 and parallel to the first electrode 15. Depths of the recesses 1213 gradually decrease following the increase of the distance between the recesses 1213 and the first electrode 15. In the present embodiment, the recesses 213 consist of a first recess 1213a, a second recess 1213b and a third recess 1213c which are defined in the second area 1212 of the surface 121 of the first type semiconductor layer 12. The second area 1212 of the first type semiconductor layer 12 is divided into four parts, region A, region B, region C and region D by the three recesses 1213a, 1213b, 1213c. It can be understood that the number of the recesses 1213 defined in the second area 1212 of the surface 121 of the first type semiconductor layer 12 is a matter of design, and can be two or more according to the demand of practical application. The recesses 1213 may have different or the same width based on demand for the size of the LED chip 10. In the present embodiment, each of the recesses 1213 is 0.2 μm in width; however, their depths are respectively 0.5 μm, 0.4 μm and 0.3 μm, for the recesses 1213a, 1213b, 1213c. The recesses 1213 each function as an air gate in the first type semiconductor layer 12.

For avoiding influencing the subsequent formation of crystal growth of the light-emitting layer 13, a semiconductor film 122 can be formed on the first type semiconductor layer 12 to cover the recesses 1213, after the recesses 1213 are defined and before the light-emitting layer 13 is formed. The semiconductor film 122 is made of the same materials as that the first type semiconductor layer 12 is made of.

When a voltage is applied between the first and second electrodes 15, 16, a current flows through the first type semiconductor layer 12 and the transparent conductive layer 19, and accordingly electrons in the first type semiconductor layer 12 move to the light-emitting layer 13 through the region A, region B, region C and region D of the first type semiconductor layer 12. In operation, the electrons in the first type semiconductor layer 12 would firstly move to the region A closest to the first electrode 15, wherein a lateral movement of the electrons is initially blocked by the first recess 1213a, so the electrons would firstly accumulate in the region A. After being saturated in the region A, the electrons overstride the first recess 1213a to reach the region B. After being saturated in the region B, the electrons overstride the second recess 1213b to reach the region C. After being saturated in the region C, the electrons overstride the third recess 1213c to reach the region D. Due to the depths of the recesses 1213 gradually decrease following an increase of the distance between the recesses 1213 and the first electrode 15, more electrons would overflow from the previous region of the first type semiconductor layer 12 to the next adjacent region of the first type semiconductor layer 12, such that electrons accumulated in a localized area of the LED chip 10 can be avoided. A uniform distribution of electrons can be achieved in the first type semiconductor layer 12, whereby the lighting efficiency of the light-emitting layer 13 will be improved. For example, since the deepest recess, i.e., the recess 1213a would initially block more electrons off, there would be more overflowed electrons from the region A to the region B. In addition, by the provision of the air in the recesses 1213 of the first type semiconductor layer 12, more light from the light emitting layer 13 can be reflected/refracted by the first type semiconductor layer 12, whereby the light extraction efficiency of the LED chip 10 can be improved.

The present disclosure further provides a method for manufacturing the LED chip 10 which comprises the following steps:

A substrate 11 is provide, a first type semiconductor layer 12 is formed on the substrate 11 and includes a first area 1211 and a second area 1212.

Three recesses 1213 are formed in the second area 1212 of the first type semiconductor layer 12 by etching, cutting or other mechanical process. The recesses 1213 are spaced apart from each other and arranged in sequence in a direction away from the first area 1211. Depths of the recesses 1213 gradually decrease following an increase of the distance from the recesses 1213 to the first area 1211.

A light-emitting layer 13 and a second type semiconductor layer 14 are formed on the second area 1212 of the first type semiconductor layer 12 in sequence.

A first electrode 15 is formed on the first area 1211 of the first type semiconductor layer 12, and a second electrode 16 is formed on the second type semiconductor layer 14.

The first type semiconductor layer 12 and the second type semiconductor layer 14 can be, for example but not limited to, an N-type epitaxial layer and a P-type epitaxial layer, respectively. Of course, the first type semiconductor layer 12 and the second type semiconductor layer 14 can be a P-type epitaxial layer and an N-type epitaxial layer, respectively.

In the method above, a buffer layer 17 can be formed on the substrate 11 firstly before forming the first type semiconductor layer 12 for easing the subsequent formation of crystal growth and lessening the lattice mismatch between the substrate 11 and the first type semiconductor layer 12.

An ohmic contact layer 18 and a transparent conductive layer 19 can be formed on the second type semiconductor layer 14 before forming the second electrode 16, whereby the second electrode 16 can be formed on the transparent conductive layer 19.

A semiconductor film 122 is formed on the first type semiconductor layer 12 to cover the recesses 1213 before forming the light-emitting layer 13 for improving the subsequent formation of crystal growth of the light-emitting layer 13. Because the semiconductor film 122 is thin, a large amount of electrons would not pass through the semiconductor film 122 through a limited area, such that the current distribution in the first type semiconductor layer 12 is still uniform.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. An LED chip comprising:
    a substrate;
    a first type semiconductor layer, a light-emitting layer and a second type semiconductor layer formed on the substrate in sequence, a surface of the first type semiconductor layer away from the substrate comprising an exposed first area uncovered by the light-emitting layer and a second area covered by the light-emitting layer;
    a first electrode formed on the exposed first area of the substrate, a plurality of recesses being defined in the second area of the surface of the first type semiconductor layer, the recesses being spaced apart from each other and arranged in sequence in a direction away from the first electrode, depths of the recesses gradually decreasing following an increase of a distance between the recesses and the first electrode; and a second electrode formed on the second type semiconductor layer, when a voltage is applied between the first and second electrodes, electrons flowing from first electrode to the second electrode via the first type semiconductor layer, the light-emitting layer and the second type semiconductor layer.

2. The LED chip according to claim 1, wherein the first type semiconductor layer and the second type semiconductor layer are an N-type epitaxial layer and a P-type epitaxial layer respectively.

3. The LED chip according to claim 2, further comprising a semiconductor film formed on the first type semiconductor layer to cover the recesses, the light-emitting layer is formed on the semiconductor film, and the semiconductor film is made of a material the same as that the first type semiconductor layer is made of.

4. The LED chip according to claim 2, further comprising a buffer layer and a transparent conductive layer formed on the substrate, the buffer layer, the first type semiconductor layer, the light-emitting layer, the second type semiconductor layer, and the transparent conductive layer are stacked on the substrate in sequence.

5. The LED chip according to claim 1, wherein the first electrode comprises two pads and a connecting portion between the two pads, the two pads are respectively located at two ends of the first electrode and the first electrode extends in a lengthwise direction of the exposed first area of the surface of the first type semiconductor layer.

6. The LED chip according to claim 1, wherein the second electrode comprises two pads and a connecting portion between the two pads, and a number of arms respectively extending from the pads substantially perpendicular to the connecting portion.

7. The LED chip according to claim 1, wherein the recesses are parallel to the first electrode.

8. A method of manufacturing an LED chip, comprising:

providing a substrate with a first type semiconductor layer formed thereon, the first type semiconductor layer comprising a first area and a second area;

forming a plurality of recesses in the second area of the first type semiconductor layer, the recesses being spaced apart from each other and arranged in sequence in a direction away from the first area, depths of the recesses gradually decreasing with an increase of a distance from the recesses to the first area;

forming a light-emitting layer and a second type semiconductor layer on the second area of the first type semiconductor layer in sequence;

forming a first electrode on the first area of the first type semiconductor layer;

forming a second electrode on the second type semiconductor layer.

9. The method according to claim 8, further comprising forming a semiconductor film on the first type semiconductor layer to cover the recesses before forming the light-emitting layer.

10. The method according to claim 8, further comprising forming an ohmic contact layer and a transparent conductive layer on the second type semiconductor layer before forming the second electrode, whereby the second electrode is formed on the transparent conductive layer.

11. The method according to claim 8, wherein the first electrode comprises two pads and a connecting portion between the two pads, the two pads are respectively located at two ends of the connecting portion, and the first electrode extends in a lengthwise direction of the exposed first area of the surface of the first type semiconductor layer.

\* \* \* \* \*